United States Patent
Blackham et al.

(10) Patent No.: US 6,823,276 B2
(45) Date of Patent: Nov. 23, 2004

(54) SYSTEM AND METHOD FOR DETERMINING MEASUREMENT ERRORS OF A TESTING DEVICE

(75) Inventors: David V. Blackham, Santa Rosa, CA (US); Kenneth H. Wong, Santa Rosa, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 89 days.

(21) Appl. No.: 10/407,671

(22) Filed: Apr. 4, 2003

(65) Prior Publication Data

US 2004/0199350 A1 Oct. 7, 2004

(51) Int. Cl.[7] .................... G01D 18/00; G01D 21/00
(52) U.S. Cl. ............................................... 702/85
(58) Field of Search ................... 702/107, 85, 108, 702/127, 189; 324/601, 637, 638

(56) References Cited

U.S. PATENT DOCUMENTS

| | | | | |
|---|---|---|---|---|
| 5,578,932 A | * | 11/1996 | Adamian | 324/601 |
| 5,748,506 A | * | 5/1998 | Bockelman | 702/85 |
| 6,060,888 A | * | 5/2000 | Blackham et al. | 324/601 |
| 6,081,125 A | * | 6/2000 | Krekels et al. | 324/601 |
| 2003/0126256 A1 | * | 7/2003 | Cruickshank et al. | 709/224 |
| 2003/0171886 A1 | * | 9/2003 | Hill et al. | 702/91 |
| 2004/0054490 A1 | * | 3/2004 | Bradley et al. | 702/107 |
| 2004/0100276 A1 | * | 5/2004 | Fanton | 324/601 |

OTHER PUBLICATIONS

Ballo, David., "Network Analyzer Basics", Hewlett–Packard Company, Back to Basics Seminar, 1998, pp. 1–108, (Retrieved on line: www.hp.com).

* cited by examiner

Primary Examiner—John Barlow
Assistant Examiner—Demetrius Pretlow

(57) ABSTRACT

A system and method are disclosed which provide for flexible and accurate test apparatus error value calculation. Error value calculation of a testing apparatus requires at least one unique measurement for each unknown error value using the equation that relates the measured response, the predicted response and the error value. When more equations than unknowns can be acquired, the system of equations is over-determined and an improvement of accuracy is possible, but accuracy may be lost when the predicted responses are not trusted to the same degree. The disclosed system and method provide the increased accuracy of an over-determined system, while accounting for predicted responses of varying degrees of trust.

40 Claims, 4 Drawing Sheets

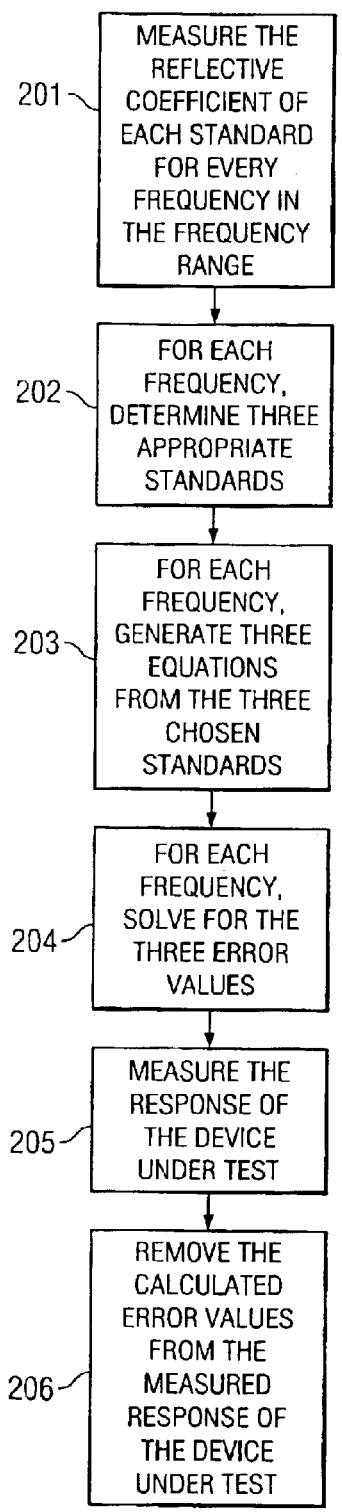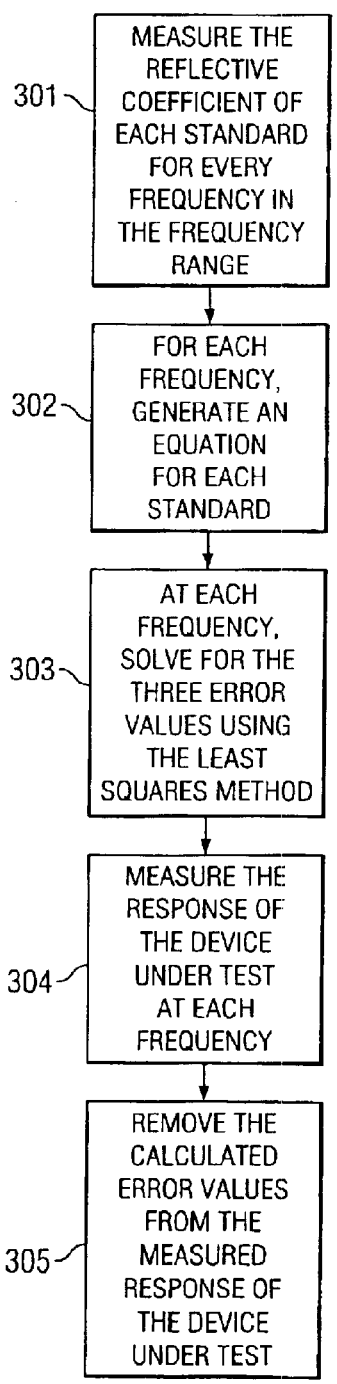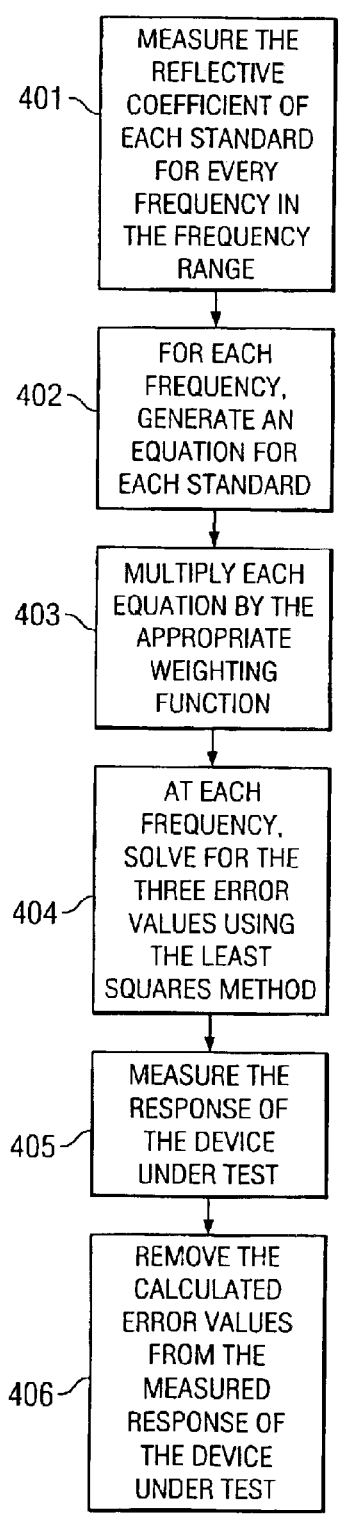

SYSTEM AND METHOD FOR DETERMINING MEASUREMENT ERRORS OF A TESTING DEVICE

TECHNICAL FIELD

The present invention relates in general to error value calculation, and more particularly to a device, system, method and code for the calculation of systematic errors related to device testing that incorporates the accuracy of a standard's predicted response.

BACKGROUND OF THE INVENTION

The accuracy of any test is dependent on how much is known about the errors associated with the testing system. Every testing system has errors that are characteristic and unique to that system, and these errors will contaminate any test that is done. This is especially crucial for high frequency electrical devices, because systematic errors attributable to the testing apparatus can drastically alter the measured responses of a device under test (DUT). However, if the errors of a testing apparatus are constant, it is possible to determine their value. Once the value of these errors are known, it becomes possible to remove them from any subsequent measurement.

For example, to properly design and assemble electrical networks, it is critical to know the specific characteristics of the constituent devices. A vector network analyzer (VNA) is used to measure the reflection magnitude and phase of high frequency devices, and this helps designers to minimize undesirable reflections of devices and systems such as cable TV systems, telecommunication systems, and high speed computer networks. Inherent to every VNA are systematic imperfections in its measurement of device response. This means that the actual reflection magnitude and phase of a network component is different from that which is measured by a network analyzer. But because the systematic errors are constant, their value can be determined and removed from subsequent measurements.

There are many different techniques for determining the values of a testing device's error known in the art. Likewise, there are many known methods of removing this error from subsequent measurements once the error is determined. Turning again to the VNA example, calibration, also known as accuracy enhancement, is a way to improve the measurement accuracy of a VNA measurement by measuring the responses of DUTs with known characteristics, known as standards, and comparing these measurements to the values the standards are known to produce. This is generally referred to as vector error calibration. Once the error values have been calculated, they can then be mathematically removed from the measured response of a network component. This calibration process is known in the art as vector error correction.

BRIEF SUMMARY OF THE INVENTION

The present invention is directed to a system and method which provide for flexible and accurate test apparatus error value calculation. Error value calculation of a testing apparatus requires at least one unique measurement for each unknown error value using the equation that relates the measured response, the predicted response and the error value. When more equations than unknowns can be acquired, the system of equations is over-determined and an improvement of accuracy is possible. According to one embodiment of the present invention a method of testing apparatus error calculation measures a response to at least one test signal of at least one standard having a predicted response to the test signal, the predicted response having an assigned accuracy, and generates, for each standard at each test signal, an equation for determining a measurement error of a testing apparatus from at least the measured response and the predicted response, and weights the equation according to the assigned accuracy of the corresponding standard.

According another embodiment of the present invention, a device for testing apparatus error calculation has a means for producing at least one test signal, a means for measuring a response of at least one standard to the test signal, the standard having a predicted response with an assigned accuracy to the test signal, a means for generating, for each standard at each test signal, an equation for determining a measurement error of a testing apparatus from at least the measured response and said predicted response, and a means for weighting each generated equation according to the assigned accuracy of the corresponding standard.

According another embodiment of the present invention, a system for testing apparatus error calculation has an element operable to produce at least one test signal, a measurement device communicatively coupled to the element and operable to measure a response of at least one standard to the test signal, wherein at least one standard has a predicted response to the test signal, said predicted response having an assigned accuracy, logic communicatively coupled to the element and the test device operable to generate, for each standard at each test signal, an equation for a measurement error of a testing apparatus from at least the measured response and the predicted response, weighting the equation according to said assigned accuracy of the corresponding standard, and the logic further operable to solve each generated equation and calculate the measurement error using a least squares technique.

According another embodiment of the present invention, computer executable software code for calculating the measurement errors of a testing apparatus includes code operable to generate, for at least one standard at least one said test signal, an equation for a measurement error of a testing apparatus from at least a measured response of the standard and a predicted response of the standard, and weighting the equation according to an assigned accuracy of said standard; and code operable to solve each generated equation and calculate the measurement error.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which:

FIG. 2 is an operational flow depicting an example of the traditional method of apparatus error calculation;

FIG. 3 is an operational flow depicting a least squares method of testing apparatus error calculation;

FIG. 4 is an operational flow depicting a weighted least squares method of error correction;

DETAILED DESCRIPTION OF THE INVENTION

Figure 1A:
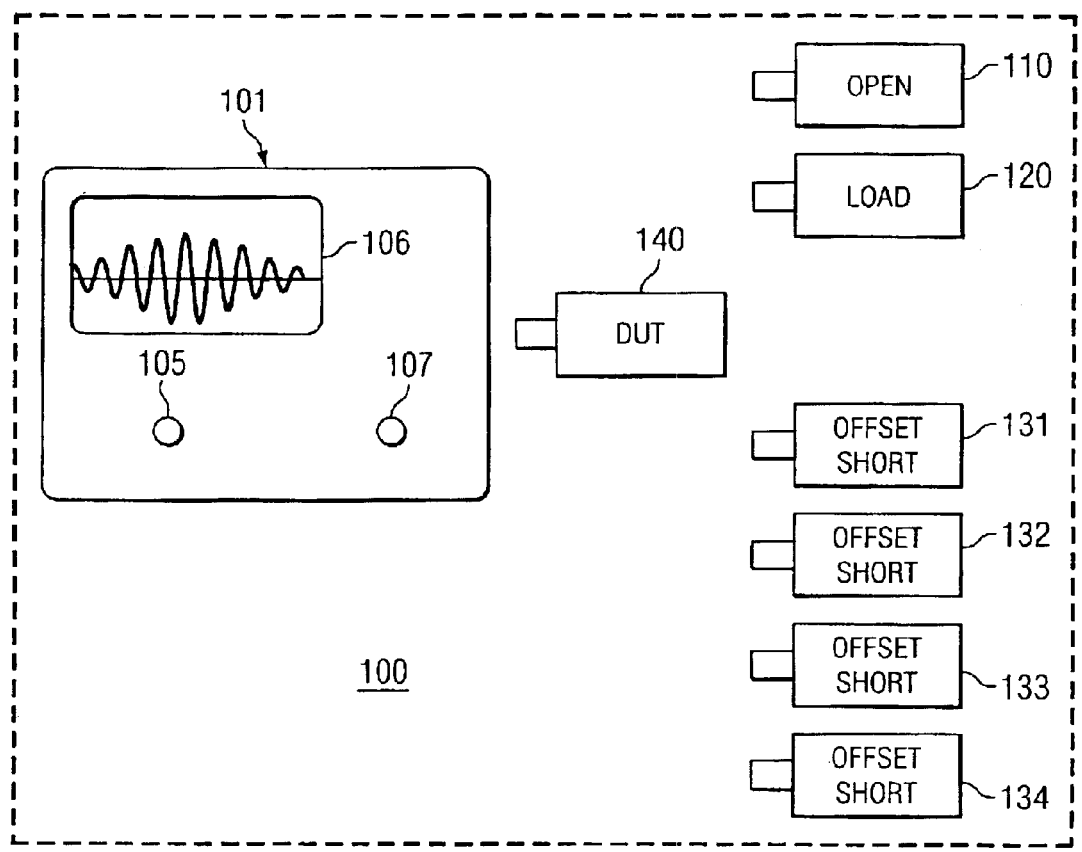
FIG. 1 is an example vector network analyzer.

Knowing the value of the errors intrinsic to a testing device is critical to the efficient and/or accurate use of such devices. For example, the actual characteristics of a DUT can only be determined if the errors associated with the testing apparatus are removed from the measurements taken. Among the applications of one embodiment of the present invention, and used here by way of example, is the vector error correction of a vector network analyzer (VNA).

In VNA calibration, one-port calibration determine the errors associated with reflection. There are three systematic errors related to VNA one-port calibration: directivity, reflection tracking, and source match. In VNA one-port calibration, the values of these vector errors are calculated, and vector error correction removes these errors from subsequent DUT measurements. Traditional one-port vector error correction uses three known reflect standards to remove these three systematic errors. With three errors as unknowns, three equations are needed to calculate them. The errors are calculated, for each frequency of interest, using a system of three equations formed from the measured responses of the three standards and the predicted responses of those standards. Often, though, no one set of three standards is adequate for use over the entire frequency range of interest. Thus, additional standards are required so that for any given frequency there remains three usable standards on which to base the three needed equations. But even though each calibration standard is typically measured over the whole frequency range, the traditional method uses measurement data for any particular standard over only a subset of the frequency range. This leads to a missed opportunity in enhancing the characterization of the systematic error terms.

More modern methods, such as electronic calibration, use the possibility of measuring multiple calibration standards with a single manual connection to a vector network analyzer test port. These methods provide a better estimate of the systematic error terms by measuring additional calibration standards and applying a standard regression method to solve the over-determined system. This improvement uses more of the data points actually measured, but still does not take full advantage of the full range of possibilities because it requires the accuracy of the predicted responses for each calibration standard to be equal for optimal results.

Thus, there exists in the art a need for a method of systematic error calculation that utilizes all of the data taken for the multiple standards, but that does not require the accuracy of each calibration standard's predicted response to be equal.

One embodiment of the present invention provides a method and system that facilitates the use all of the data collected regarding the measurement of standards. This leads to more accurate error calculation and subsequent correction. Turning again to the example of the VNA, the three systematic errors related to VNA one-port measurements are determined by solving a system of equations derived from the measurement of standards. These standards approximate circuit conditions that have responses to different frequencies of test signals that are well known in the art. The equations for the effect of the three sources of VNA measurement error are also well known. It will be useful to disclose the mathematics of this embodiment of the present invention by way of the VNA example.

For one port VNA error correction, the purpose is to determine the actual reflection response of a device under test (DUT) by removing from the measured reflection response the portions corresponding to systematic errors. It is useful to network designers to characterize the reflection response of a DUT in terms of its reflection coefficient. For VNAs, the relationship between the measured reflection coefficient ($\Gamma_m$), the actual reflection coefficient ($\Gamma_a$), and the systematic errors of directivity ($e_{00}$), reflection tracking ($e_{10}e_{01}$), and source match ($e_{11}$) is given as:

$$\Gamma_m = e_{00} + \frac{e_{10}e_{01}\Gamma_a}{1 - e_{11}\Gamma_a} \quad (0.1)$$

Equation (0.1) can be rewritten as:

$$\Gamma_m = e_{00} - (e_{11}e_{00} - e_{10}e_{01})\Gamma_a + e_{11}\Gamma_m\Gamma_a \quad (0.2)$$

Since there are three unknown systematic error terms, measurements of at least three calibration standards with known reflection coefficients are required at each frequency of interest.

This procedure can be written in matrix form as:

$$\begin{bmatrix} 1 & \Gamma_{m1}\Gamma_{a1} & -\Gamma_{a1} \\ 1 & \Gamma_{m2}\Gamma_{a2} & -\Gamma_{a2} \\ 1 & \Gamma_{m3}\Gamma_{a3} & -\Gamma_{a3} \end{bmatrix} \cdot \begin{bmatrix} e_{00} \\ e_{11} \\ e_{11}e_{00} - e_{10}e_{01} \end{bmatrix} = \begin{bmatrix} \Gamma_{m1} \\ \Gamma_{m2} \\ \Gamma_{m3} \end{bmatrix} \quad (0.3)$$

The solution is given as:

$$\begin{bmatrix} e_{00} \\ e_{11} \\ e_{11}e_{00} - e_{10}e_{01} \end{bmatrix} = \begin{bmatrix} 1 & \Gamma_{m1}\Gamma_{a1} & -\Gamma_{a1} \\ 1 & \Gamma_{m2}\Gamma_{a2} & -\Gamma_{a2} \\ 1 & \Gamma_{m3}\Gamma_{a3} & -\Gamma_{a3} \end{bmatrix}^{-1} \cdot \begin{bmatrix} \Gamma_{m1} \\ \Gamma_{m2} \\ \Gamma_{m3} \end{bmatrix} \quad (0.4)$$

In general, for numeric robustness, the calibration standards are chosen so that they are distinct from each other, and are selected to maximize the difference between their reflection coefficients. The traditional OSL (open/short/load) vector error correction method measures three known standards (open, short, and load). These standards approximate circuit conditions that result in predictable reflections when tested. When these standards are measured by the VNA, the reflection coefficients that are measured and the reflection coefficients that are predicted are used to obtain three equations with three unknowns, allowing each of the three systematic error terms to be characterized at each frequency.

Open, short and load calibration standards have measured reflection coefficients and predicted reflection coefficients that are quite distinct over a wide frequency range.

Often, however, additional calibration standards are necessary to maintain an adequate difference between the reflection coefficients of the calibration standards. An example of this is the use of multiple offset shorts as calibration standards. A set of three offset shorts is inherently limited in the frequency range, because at low frequencies their reflection coefficients will not be adequately different. In addition, at higher frequencies there are times when the phase response of the standards will be too close for adequate separation.

In the case of calibrations using a sliding load, multiple load standards may be required. A fixed load is typically used to cover the low frequency range where the sliding load does not work adequately. At higher frequencies the sliding load can provide a much more accurate calibration standard than a fixed load. A calibration procedure often used today has a threshold frequency below which the fixed load is used and above which the sliding load is used. This leads to a discontinuity in the calculation of the systematic errors that is visible in subsequent error corrected measurements.

More modern methods use a least squares solution to take advantage of the increased accuracy obtainable with an over-determined system. The following matrix equations outlines the least-squares procedure:

$$\begin{bmatrix} 1 & \Gamma_{m1}\Gamma_{a1} & -\Gamma_{a1} \\ 1 & \Gamma_{m2}\Gamma_{a2} & -\Gamma_{a2} \\ 1 & \Gamma_{m3}\Gamma_{a3} & -\Gamma_{a3} \\ \vdots & \vdots & \vdots \\ 1 & \Gamma_{mn}\Gamma_{an} & -\Gamma_{an} \end{bmatrix} \cdot \begin{bmatrix} e_{00} \\ e_{11} \\ e_{11}e_{00} - e_{10}e_{01} \end{bmatrix} = \begin{bmatrix} \Gamma_{m1} \\ \Gamma_{m2} \\ \Gamma_{m3} \\ \vdots \\ \Gamma_{mn} \end{bmatrix} \quad (0.5)$$

Equation (0.5) can be rewritten as:

$$A \cdot x = b \quad (0.6)$$

An optimal solution is given as:

$$x = (A^H \cdot A)^{-1} \cdot A^H \cdot b \quad (0.7)$$

where $A^H$ the conjugate transpose of A.

The least squares solution works well when predicted responses of the standards are trusted to the same degree. That is to say the predicted reflection coefficients of each standard is known to the same accuracy. This is a reasonable assumption for some methods, but is not a valid assumption for others. For example, in the sliding load calibration procedure described above, the accuracy of the predicted reflection coefficient for the fixed load is much better than the accuracy of the predicted reflection coefficient for the sliding load at low frequencies, and much worse at high frequencies.

When one embodiment of the present invention is applied to the VNA error calculation example, one embodiment may implement a weighted least squares solution approach that provides an improved method of handling the case where the predicted responses are not all trusted to the same degree. If the predicted responses are all independent but not equally trusted, an optimal solution is best obtained by multiplying each equation by a weighting factor that is proportional to the level of trust associated with the predicted reflection coefficient of a standard at a given frequency. Equation (0.5) becomes $$\begin{bmatrix} \frac{1}{\sigma_1^2} & \frac{\Gamma_{m1}\Gamma_{a1}}{\sigma_1^2} & \frac{-\Gamma_{a1}}{\sigma_1^2} \\ \frac{1}{\sigma_2^2} & \frac{\Gamma_{m2}\Gamma_{a2}}{\sigma_2^2} & \frac{-\Gamma_{a2}}{\sigma_2^2} \\ \frac{1}{\sigma_3^2} & \frac{\Gamma_{m3}\Gamma_{a3}}{\sigma_3^2} & \frac{-\Gamma_{a3}}{\sigma_3^2} \\ \vdots & \vdots & \vdots \\ \frac{1}{\sigma_n^2} & \frac{\Gamma_{mn}\Gamma_{an}}{\sigma_n^2} & \frac{-\Gamma_{an}}{\sigma_n^2} \end{bmatrix} \cdot \begin{bmatrix} e_{00} \\ e_{11} \\ e_{11}e_{00} - e_{10}e_{01} \end{bmatrix} = \begin{bmatrix} \frac{\Gamma_{m1}}{\sigma_1^2} \\ \frac{\Gamma_{m2}}{\sigma_2^2} \\ \frac{\Gamma_{m3}}{\sigma_3^2} \\ \vdots \\ \frac{\Gamma_{mn}}{\sigma_n^2} \end{bmatrix} \quad (0.8)$$

where $\sigma_i$ is the weighting factor for the $i^{th}$ equation.

In addition, the predicted responses may not all be independent. Strictly speaking, previous methods would fall into this category since all of the internal states are measured on a single test system. For this case equation (0.7) would become $$x = (A^H \cdot W^H \cdot W \cdot A)^{-1} \cdot A^H \cdot W^H \cdot W \cdot b \quad (0.9)$$

where:

$$W = \begin{bmatrix} \frac{1}{\sigma_{11}} & \frac{1}{\sigma_{12}} & \frac{1}{\sigma_{13}} & \cdots & \frac{1}{\sigma_{1n}} \\ \frac{1}{\sigma_{21}} & \frac{1}{\sigma_{22}} & \frac{1}{\sigma_{23}} & & \\ \frac{1}{\sigma_{31}} & \frac{1}{\sigma_{32}} & \frac{1}{\sigma_{33}} & & \vdots \\ \vdots & & & \ddots & \\ \frac{1}{\sigma_{n1}} & & \cdots & & \frac{1}{\sigma_{nn}} \end{bmatrix} \quad (0.10)$$

Where $\sigma_{ij}^2$ is the covariance of calibration standard j with respect to calibration standard i.

Furthermore, calibration standards may be very similar to each other at some frequency. Their weighting factors may be adjusted according to their proximity to each other.

For the general case, equation (0.10), then becomes:

$$W = \begin{bmatrix} \frac{p1}{\sigma_{11}} & \frac{p1}{\sigma_{12}} & \frac{p1}{\sigma_{13}} & \cdots & \frac{p1}{\sigma_{1n}} \\ \frac{p2}{\sigma_{21}} & \frac{p2}{\sigma_{22}} & \frac{p2}{\sigma_{23}} & & \\ \frac{p3}{\sigma_{31}} & \frac{p3}{\sigma_{32}} & \frac{p3}{\sigma_{33}} & & \vdots \\ \vdots & & & \ddots & \\ \frac{pn}{\sigma_{n1}} & & \cdots & & \frac{pn}{\sigma_{nn}} \end{bmatrix} \quad (0.11)$$

where p1 to pn are proximity factors of the calibration standards. Proximity factors have a maximum value of one and a minimum value of $1/(n-2)$ in this example implementation.

Figure 1B:
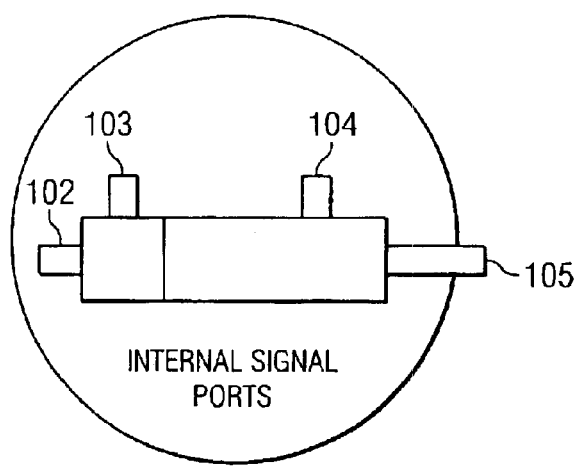

As an example of one embodiment, FIG. 1A shows a VNA system 100. This system 100 has a VNA 101 which houses outputs 105 and 107 and display 106. The internal signal ports for output ports 105 and 107 are similar. As shown in FIG. 1B, each internal signal port comprises an input port 102, a reference port 103, and a reflection port 104. As standards, system 100 has a series of offset shorts 131–134, an open circuit 10, and a load 120. The standards and the DUT 140 are connected to the output ports 105 or 107. For error correction, system 100 first measures with VNA 101 the responses of the open circuit 110, a load 120, and each of the offset shorts 131–134 across all of the frequencies of interest using detected signals at the reflection port and the reference port. These measurements may then be used to calculate the systematic errors of VNA 101 through the methods depicted in FIGS. 2–4, as examples.

The traditional method for vector error correction, depicted in the operational flow diagram of FIG. 2, solves three unknowns derived from three equations for each frequency of interest. Operational block 201 indicates the measurement of the standard's responses to the frequencies of interest, as described above for FIG. 1A. The traditional method requires the selection, at each frequency, of three standards from the measured group that are appropriate for each frequency in operational block 202. For example, referring to FIG. 1A, for low frequencies, the open circuit 10, one of the offset shorts 131, and the load 120 might be used to compute the error values. As frequency increases, separation among the offset shorts 131–134 would increase, thus three offset shorts (131, 132, 133, for example) might be used to calculate the error values. As the frequencies increase, some of the offset shorts begin to become coincident with each other, and it may become necessary to select different offset shorts (132, 133 and 134, for example) to calculate the error values. When three standards are chosen for each frequency of interest, three equations are generated in operational block 203, in the manner described for equation (0.4) above. These equations are then solved in operational block 204. The response of the DUT is measured in operational block 205, and the resulting error values are mathematically removed in operational block 206.

The least squares method of vector error correction, depicted in operational flow diagram of FIG. 3, also includes the measurement of each standard 110, 120, and 131–134, of FIG. 1A, in operational block 301. But unlike the traditional method, the least squares method generates equations for each standard over the entire frequency range in operational block 302. The systematic error values for each frequency are calculated in operational block 303 using the least squares method as illustrated in equations 0.4–0.7. The response of the DUT is measured at each frequency in operational block 304, and the resulting error values are mathematically removed in operational block 305. Because the system contains more equations than unknowns, increased accuracy is typically achieved over the method of FIG. 2.

However, the predicted responses for these standards are not equally accurate over all frequency ranges, and some error calculation accuracy is sacrificed as the predicted responses for the standards become less reliable. When used for the example application of VNA error correction described above, one embodiment of the present invention, depicted in the operational flow diagram of FIG. 4, measures all standards with the VNA in operational block 401. Equations for each standard over the entire frequency range are then generated in operational block 402. However, the use of the weighting functions in operational block 403 causes less accurate predicted reflections to have a smaller impact on the solution. The systematic error values for each frequency is calculated using the least squares method as illustrated in equations 0.8–0.11 in operational block 404. The response of of the DUT is measured at each frequency in operational block 405, and the resulting error values can be mathematically removed in operational block 406. Thus the overdetermined system retains the increased accuracy of the least squares method, but avoids the accuracy loss as the predicted reflections for particular standards become less reliable.

Figure 5:
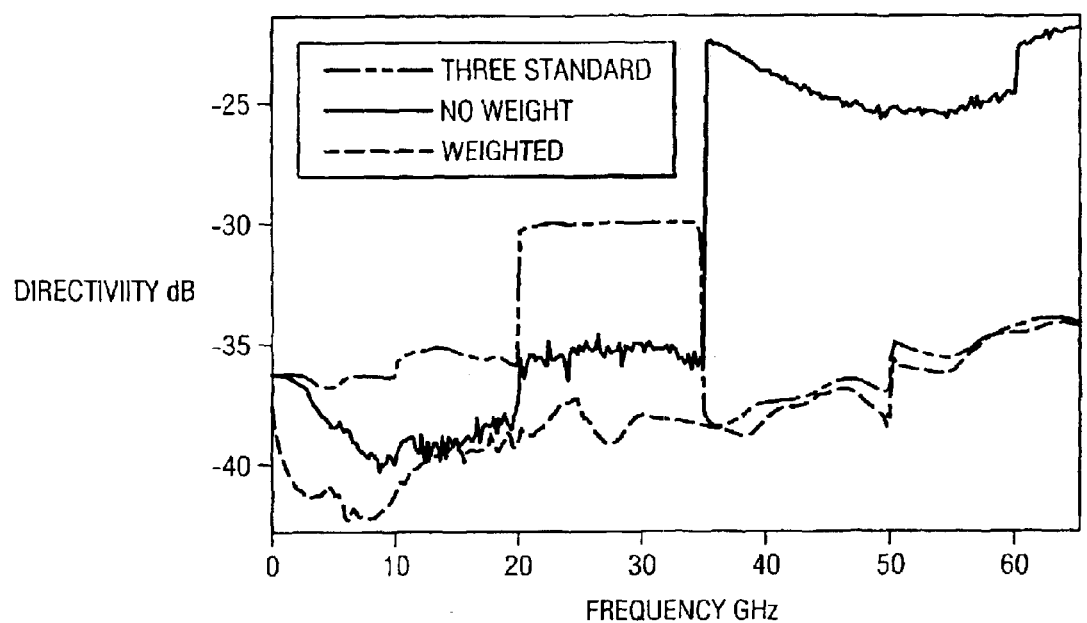
FIG. 5 is a graph depicting the results of directivity error calculation using various methods.
Figure 6:
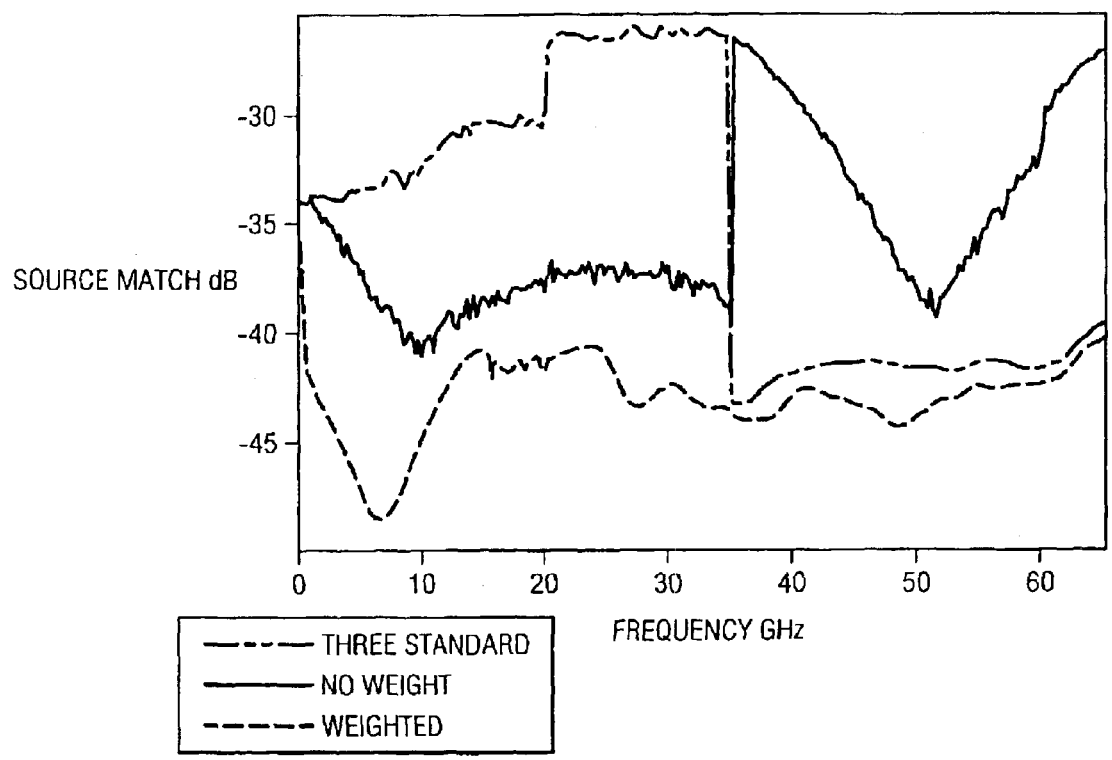
FIG. 6 is a graph depicting the results of reflection tracking error calculation using various methods.
Figure 7:
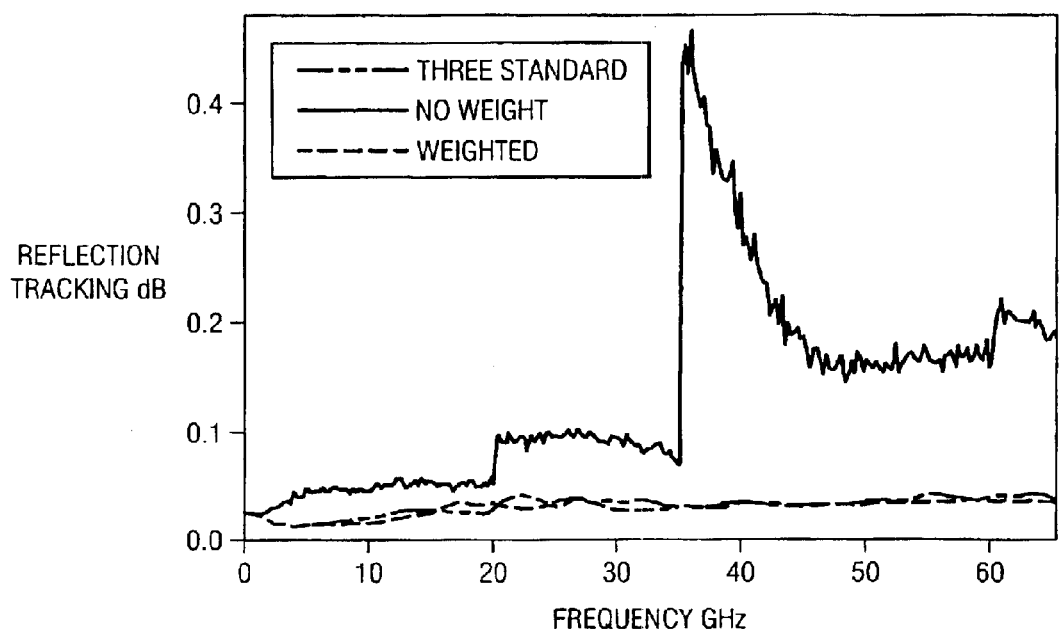
FIG. 7 is a graph depicting the results of source match error calculation using the various methods of FIG. 6.

Examples of such solutions are shown in FIGS. 5, 6, and 7. FIG. 5 shows a graph of a simulated solution for the directivity error of a VNA. Shown on this graph are the solutions as found by the original three equation method of FIG. 2, the more modern least squares method of FIG. 3, and by an application of the weighted least squares embodiment of the present invention shown in FIG. 4. FIG. 6 shows a simulated solution for the reflection tracking error of a VNA. Shown on this graph are the solutions as found by the original three equation method of FIG. 2, the more modern least squares method of FIG. 3, and by an application of the weighted least squares embodiment of the present invention shown in FIG. 4. FIG. 7 shows a simulated solution for the source match error of a VNA. Shown on this graph are the solutions as found by the original three equation method of FIG. 2, the more modern least squares method of FIG. 3, and by an application of the weighted least squares embodiment of the present invention shown in FIG. 4.

It will be readily apparent to one skilled in the art that the embodiments of the present invention can be used with any number of standard response prediction techniques. In the VNA standard example described above, any of techniques commonly used to predict the reflection coefficient of a standard could be used in embodiments of the present invention. An actual response model is the modeled response of a specific device. For example, the physical dimensions of a "short" can be measured and from this an actual response model can be created for that short based on its physical properties. In the alternative, a nominal response model, the modeled response of the average characteristics of a device group of the same design, could be used. For a group of shorts, the physical dimensions of a plurality of shorts are measured and then the average value of each of the dimensions may be used to create the nominal response model. In addition, for each of the response models above, either a data base model or a polynomial fitted model could be created.

Alternatively, actual responses, rather than response models may be used. These responses are the actual measured response of a standard as found by a highly trusted source, such as a national laboratory. Instead of creating a model based on physical properties, the present invention could use the actual electrically measured response of a standard for some applications.

Certain embodiments of the present invention may be implemented as computer-readable code designed to accomplish the method described above; the VNA example is again useful as an example. The predicted responses of standards is easily stored in a computer readable database. This format is also convenient for the storage of the weighting factors associated with the predicted response of a standard. In certain implementations, computer code may be employed that, when executed, prompts the user to select the standards being used for the VNA calculation, and then accesses a database containing the predicted responses for the selected standards. This application may further comprise code operable to store the reflection responses of the standards as they are measured by the VNA. When the VNA measurements of the standards are complete, the code may execute to generate the equations and calculate the values of the systematic errors based on the stored databases and the measured values. It will be appreciated that this embodiment of the present invention is not limited to use with VNA error calculations, nor is the present invention limited to the steps outlined above.

When implemented via computer-executable instructions, various elements of embodiments of the present invention are in essence the software code defining the operations of such various elements. The executable instructions or software code may be obtained from a readable medium (e.g., a hard drive media, optical media, EPROM, EEPROM, tape media, cartridge media, flash memory, ROM, memory stick, and/or the like) or communicated via a data signal from a communication medium (e.g., the Internet). In fact, readable media can include any medium that can store or transfer information.

Figure 8:
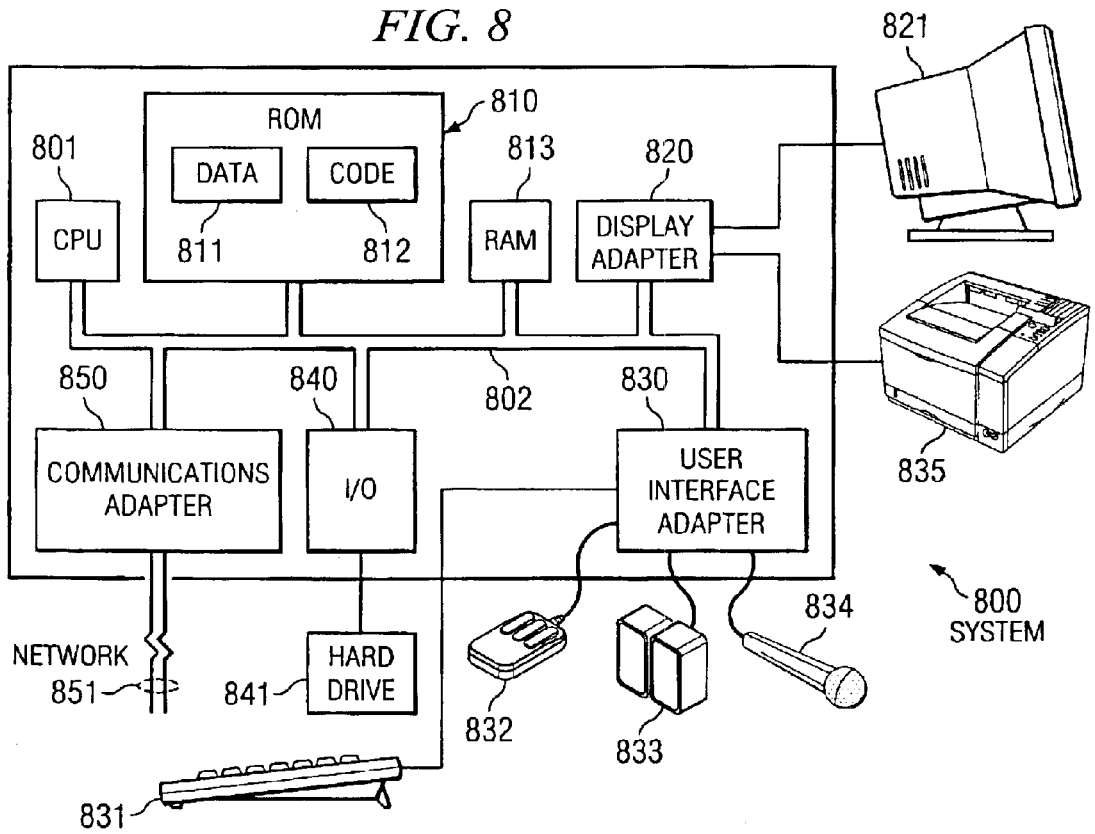
FIG. 8 is an example apparatus according to an embodiment of the present invention.

FIG. 8 also illustrates an example system 800 adapted according to embodiments of the present invention. That is, system 800 comprises an example system on which embodiments of the present invention may be implemented (such as VNA 100 depicted in FIG. 1). Central processing unit (CPU) 801 is coupled to system bus 802. CPU 801 may be any general purpose CPU. Suitable processors include without limitation any processor from HEWLETT-PACKARD's ITANIUM family of processors, HEWLETT-PACKARD's PA-8500 processor, or INTEL's PENTIUM® 4 processor, as examples. However, the present invention is not restricted by the architecture of CPU 801 as long as CPU 801 supports the inventive operations as described herein. CPU 801 may execute the various logical instructions according to embodiments of the present invention. For example, CPU 801 may execute machine-level instructions according to the exemplary operational flow described above in conjunction with FIG. 4.

Computer system 800 also preferably includes random access memory (RAM) 813, which may be SRAM, DRAM, SDRAM, or the like. Computer system 800 preferably includes read-only memory (ROM) 810 which may be PROM, EPROM, EEPROM, or the like. RAM 813 and ROM 810 hold user and system data and programs, as is well known in the art.

Computer system 800 also preferably includes input/output (I/O) adapter 840, communications adapter 850, user interface adapter 830, and display adapter 820. I/O adapter 840, user interface adapter 830, and/or communications adapter 850 may, in certain embodiments, enable a user to interact with computer system 800 in order to input information, such as actual response models for the standards being measured.

I/O adapter 840 preferably connects to storage device(s) 841, such as one or more of hard drive, compact disc (CD) drive, floppy disk drive, tape drive, etc. to computer system 800. The storage devices may be utilized when RAM 813 is insufficient for the memory requirements associated with storing data for the above described methods. Communications adapter 850 is preferably adapted to couple computer system 800 to network 851. User interface adapter 830 couples user input devices, such as keyboard 831, pointing device 832, and microphone 834 and/or output devices, such as speaker(s) 833 or printing device 835 to computer system 800. Display adapter 820 is driven by CPU 801 to control the display on display device 821 to, for example, display the calculated error values (such as that of FIGS. 5–7) found by the method of the present invention.

It shall be appreciated that the present invention is not limited to the architecture of system 800. For example, any suitable processor-based device may be utilized, including without limitation personal computers, laptop computers, computer workstations, and multi-processor servers. It shall also be appreciated that all or some of the elements depicted in FIG. 8 may be incorporated with the CPU, into a single stand alone device. Moreover, embodiments of the present invention may be implemented on application specific integrated circuits (ASICs) or very large scale integrated (VLSI) circuits. In fact, persons of ordinary skill in the art may utilize any number of suitable structures capable of executing logical operations according to the embodiments of the present invention.

It will be appreciated by one of ordinary skill in the art that the code described above could be altered to allow a user to input their own data regarding the predicted responses of the standards or the accuracy of those predictions. These predicted responses could be in a computer readable database, manually entered by the user, readable medium (e.g., a hard drive media, optical media, EPROM, EEPROM, tape media, cartridge media, flash memory, ROM, memory stick, and/or the like) or communicated via a data signal from a communication medium (e.g., the Internet). In fact, readable media can include any medium that can store or transfer information.

It will be further appreciated that various techniques now known or later developed may be included in the system for further accuracy. By way of example, the VNA weighted least squares error calculation described above may be made a "robust" weighted least squares error calculation through repeated iterations of the calculation. After the error values of a VNA have been determined through the described technique, the standards could again be measured, and the determined systematic errors of the VNA mathematically removed from this new measurement. This new measurement of the standard can then be compared to the original predicted response for this standard. The differences between the predicted response and the new measured response can then be used to calculate new weighting factors for the equations associated with this standard. The effect of outlier data points can be minimized through this procedure. It will be appreciated that this robust weighted least squares technique is not limited to the VNA example, but may be applied to all embodiments of the present invention.

It will be apparent to one skilled in the art that additional embodiments of the present invention could be used to solve the systematic error terms of VNA with N-ports where N>=1 that also include transmission systematic error terms, forward transmission tracking and reverse transmission tracking errors. The number of systematic error terms is equal to $4*N-1$. For a 2-port VNA, 7 systematic errors terms need to be determined. Equations 0.5 to 0.11 may be expanded to include the additional error terms, measured and predicted calibration standard responses.

It will be apparent to one skilled in the art that an embodiment of the present invention may be implemented as a group of devices or a single device. For example, one embodiment of the present invention may be implemented as a single VNA apparatus that incorporates the method described above and an embodiment of the code or other implementation. It will be apparent to one skilled in the art that current VNA test systems can be outfitted with the necessary firmware and physical upgrades to utilize a weighted least squares calibration technique as well as being upgradeable.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for determining the measurement errors of a testing apparatus, comprising:

measuring a response to at least one test signal of at least one standard having a predicted response to said test signal, said predicted response having an assigned accuracy; and generating, for each said standard at each said test signal, an equation for determining a measurement error of a testing apparatus from at least the measured response and said predicted response, and weighting said equation according to said assigned accuracy.

2. The method of clam 1 further comprising:

solving for each generated equation, and calculating said measurement error.

3. The method of claim 2 where said calculating said measurement error uses a least squares technique.

4. The method of claim 3 where said least squares technique is a robust least squares technique.

5. The method of claim 2 where said testing apparatus is a Vector Network Analyzer.

6. The method of claim 5 wherein the at least one test signal comprises at least a plurality of frequencies.

7. The method of claim 6 with a plurality of measurement errors comprising the systematic errors of directivity, reflection tracking, and source match.

8. The method of claim 7 that measures responses of a network device to the test signals.

9. The method of claim 8 that removes said measurement errors from the measured responses of the network device.

10. A device for determining the measurement errors of a testing apparatus, comprising:

means for producing at least one test signal;

means for measuring a response of at least one standard to said test signal, said standard having a predicted response with an assigned accuracy to said test signal;

means for generating, for each said standard at each said test signal, an equation for determining a measurement error of a testing apparatus from at least the measured response and said predicted response; and means for weighting said equation according to said assigned accuracy.

11. The device of claim 10 further comprising:

means for solving each generated equation and calculating said measurement error.

12. The device of claim 11 where said calculating the said measurement error uses a least squares technique.

13. The device of claim 12 where said least squares technique is a robust least squares technique.

14. The device of claim 11 where said testing apparatus is a vector network analyzer.

15. The device of claim 14 wherein the at least one test signal comprises at least a plurality of frequencies.

16. The device of claim 15 with a plurality of measurement errors comprising the systematic errors of directivity, reflection tracking, and source match.

17. The device of claim 16 that further comprises a means for measuring a response of a network device to said test signals.

18. The device of claim 17 that further comprises a means for removing said measurement errors of said network analyzer from the measured response of said network device.

19. The device of claim 18, where at least the means for calculating said measurement errors and said means for removing said measurement errors of said network analyzer from said measured responses of said network device is computer executable software codes.

20. A system that determines the measurement errors of a testing apparatus, comprising:

an element operable to produce at least one test signal;

a measurement device communicatively coupled to said element and operable to measure a response of at least one standard to said test signal, wherein said at least one standard has a predicted response to said test signal, said predicted response having an assigned accuracy;

logic communicatively coupled to said element and said test device operable to generate, for each said standard at each said test signal, an equation for a measurement error of a testing apparatus from at least the measured response and said predicted response;

said logic further operable to weight said equation according to said assigned accuracy; and said logic further operable to solve each generated equation and calculate said measurement error using a least squares technique.

21. The system of claim 20, where said least squares technique is a robust least squares technique.

22. The system of claim 20, where said testing apparatus is a vector network analyzer.

23. The system of claim 22, wherein the at least one test signal comprises at least a plurality of frequencies.

24. The system of claim 23 with a plurality of measurement errors comprising the systematic errors of directivity, reflection tracking, and source match.

25. The system of claim 24 where the measurement device is further operable to measure the response of a network device to said test signals.

26. The system of claim 25 the logic is further operable to remove said measurement errors of said network analyzer from said measured responses to said test signals of the said network device.

27. The system of claim 26, where at least the said logic is computer-readable software code.

28. Computer executable software code stored on a computer-readable medium, the code for determining the measurement errors of a testing apparatus, the code comprising:

code operable to generate, for at least one standard at at least one test signal, an equation for a measurement error of a testing apparatus from at least a measured response of said standard and a predicted response of said standard; and code operable to weight each said equation according to an assigned accuracy of said corresponding standard.

29. The code of claim 28 further comprising:

code operable to solve each generated equation and calculate said measurement error.

30. The code of claim 28 further operable to acquire said measured response of said standard to said test signal.

31. The code of claim 28 further operable to acquire said predicted response of said standard to said test signal.

32. The code of claim 28 further operable to acquire said assigned accuracy of said predicted response.

33. The code of claim 28 where said code operable to calculate said measurement error uses a least squares technique.

34. The code of claim 33 where the said least squares technique is a robust least squares technique.

35. The code of claim 29, where said testing apparatus is a vector network analyzer.

36. The code of claim 35, wherein the at least one test signal comprises at least a plurality of frequencies.

37. The code of claim 36 with a plurality of measurement errors comprising the systematic errors of directivity, reflection tracking, and source match.

38. The cod eof claim 37 further operable to acquire a measured response of a network device to said test signals.

39. The code of claim 38 further operable to calculate an actual response of said network device by removing said measurement errors from said measured response of said plurality of said network device to said test signals.

40. The code of claim 39 further operable to acquire data relating to said standards from the user.

* * * * *